(12) United States Patent
Mani

(10) Patent No.: US 10,043,969 B2
(45) Date of Patent: Aug. 7, 2018

(54) MEMORY CIRCUIT AND METHOD OF FORMING THE SAME USING REDUCED MASK STEPS

(71) Applicant: III HOLDINGS 1, LLC, Wilmington, DE (US)

(72) Inventor: Krishnakumar Mani, San Jose, CA (US)

(73) Assignee: III HOLDINGS 1, LLC, Wilmington, DE (US)

( * ) Notice: Subject to any disclaimer, the term of this patent is extended or adjusted under 35 U.S.C. 154(b) by 0 days.

(21) Appl. No.: 14/726,938

(22) Filed: Jun. 1, 2015

(65) Prior Publication Data

US 2015/0380639 A1   Dec. 31, 2015

Related U.S. Application Data

(60) Continuation of application No. 14/264,914, filed on Apr. 29, 2014, now Pat. No. 9,054,292, which is a
(Continued)

(51) Int. Cl.
*H01L 21/00* (2006.01)
*H01L 43/12* (2006.01)
(Continued)

(52) U.S. Cl.
CPC ............. *H01L 43/12* (2013.01); *G11C 8/00* (2013.01); *H01L 27/222* (2013.01);
(Continued)

(58) Field of Classification Search
CPC ........ H01L 43/12; H01L 43/08; H01L 27/226
See application file for complete search history.

(56) References Cited

U.S. PATENT DOCUMENTS 6,803,618 B2 * 10/2004 Honigschmid ......... G11C 11/16
257/295
6,885,577 B2 * 4/2005 Tang ....................... G11C 11/16
365/158
(Continued)

FOREIGN PATENT DOCUMENTS

JP   WO 2009031387 A1 *  3/2009   ............. B82Y 10/00
WO   WO 2013112615 A1 *  8/2013   ........... G11C 11/161

*Primary Examiner* — Laura Menz
(74) *Attorney, Agent, or Firm* — McAndrews, Held & Malloy, Ltd.

(57) ABSTRACT

Disclosed is a memory circuit and method of forming the same. The memory circuit comprises a lower metallization layer defining first conducting lines. A continuous magnetic storage element stack is atop the lower metallization layer wherein a bottom electrode of the stack is in direct contact with the first conducting lines. An upper metallization layer is atop the continuous magnetic storage element stack, the upper metallization layer defining second conducting lines, which are in direct contact with said continuous magnetic storage element stack. Localized areas of the continuous magnetic storage element stack define discrete magnetic bits, each energizable through a selected pair of the first and second conducting lines. In a second aspect and a third aspect, the continuous magnetic storage element stack is respectively partially and fully etched through a single mask, to define the discrete magnetic bits.

9 Claims, 5 Drawing Sheets

Related U.S. Application Data division of application No. 12/960,430, filed on Dec. 3, 2010, now Pat. No. 8,711,612.

(51) Int. Cl.
  G11C 8/00 (2006.01)
  H01L 43/02 (2006.01)
  H01L 27/22 (2006.01)
  H01L 43/08 (2006.01)

(52) U.S. Cl.
  CPC .......... *H01L 27/226* (2013.01); *H01L 27/228* (2013.01); *H01L 43/02* (2013.01); *H01L 43/08* (2013.01)

(56) References Cited

U.S. PATENT DOCUMENTS

| | | | |
|---|---|---|---|
| 7,009,873 B2 | 3/2006 | Yoda | |
| 7,057,222 B2 | 6/2006 | Jeong | |
| 7,092,283 B2 | 8/2006 | Jeong | |
| 7,126,201 B2* | 10/2006 | Matsutera | B82Y 25/00 257/421 |
| 7,145,796 B2* | 12/2006 | Fukuzumi | G11C 11/15 365/158 |
| 7,164,598 B2* | 1/2007 | Jeong | G11C 11/16 365/158 |
| 7,193,890 B2 | 3/2007 | Nagase | |
| 7,195,929 B2* | 3/2007 | Park | B82Y 10/00 257/E21.665 |
| 7,276,384 B2 | 10/2007 | Parkin | |
| 7,394,683 B2 | 7/2008 | Kumar | |
| 7,579,197 B1 | 8/2009 | Li | |
| 7,649,765 B2 | 1/2010 | Mani | |
| 7,683,447 B2 | 3/2010 | Wang | |
| 7,732,881 B2* | 6/2010 | Wang | G11C 11/15 257/295 |
| 7,787,289 B2 | 8/2010 | Mani | |
| 7,830,704 B1 | 11/2010 | Mani | |
| 7,885,105 B2 | 2/2011 | Li | |
| 7,893,511 B2* | 2/2011 | Ruehrig | H01L 27/222 257/421 |
| 7,894,252 B2 | 2/2011 | Mani | |
| 7,944,737 B2 | 5/2011 | Mani | |
| 7,981,697 B2* | 7/2011 | Wang | G11C 11/15 257/295 |
| 8,018,011 B2* | 9/2011 | Ranjan | G11C 11/5607 257/421 |
| 8,058,696 B2* | 11/2011 | Ranjan | B82Y 10/00 257/421 |
| 8,203,870 B2* | 6/2012 | Amin | G11C 11/5607 365/148 |
| 8,320,175 B2 | 11/2012 | Mani | |
| 8,330,240 B2* | 12/2012 | Ranjan | G11C 11/5607 257/421 |
| 8,369,135 B1* | 2/2013 | Mani | G11O 5/063 365/158 |
| 8,400,866 B2* | 3/2013 | Mani | G11C 11/16 365/171 |
| 8,422,286 B2* | 4/2013 | Ranjan | G11C 11/161 365/148 |
| 8,535,952 B2* | 9/2013 | Ranjan | B82Y 10/00 257/295 |
| 8,680,592 B2* | 3/2014 | Li | B82Y 25/00 257/12 |
| 8,711,612 B1* | 4/2014 | Mani | G11C 8/00 365/151 |
| 8,730,719 B1* | 5/2014 | Mani | G11C 11/161 365/158 |
| 8,767,435 B1* | 7/2014 | Mani | G11C 17/02 365/96 |
| 8,804,413 B2* | 8/2014 | Li | G11C 11/1659 365/158 |
| 8,809,827 B1* | 8/2014 | Annunziata | H01L 29/82 257/2 |
| 8,879,306 B2* | 11/2014 | Mani | H01L 43/08 365/148 |
| 8,879,314 B2* | 11/2014 | Mani | G11C 11/36 257/40 |
| 8,900,883 B1* | 12/2014 | Mani | H01L 43/12 438/3 |
| 8,913,424 B2* | 12/2014 | Mani | G11C 11/161 365/158 |
| 9,054,292 B2* | 6/2015 | Mani | G11C 8/00 |
| 9,136,465 B2* | 9/2015 | Mani | H01L 43/08 |
| 9,299,744 B2* | 3/2016 | Mani | G11C 11/16 |
| 2003/0214836 A1* | 11/2003 | Oh | G11C 11/16 365/158 |
| 2003/0218926 A1* | 11/2003 | Honigschmid | G11C 11/16 365/200 |
| 2004/0084702 A1 | 5/2004 | Jeong | |
| 2004/0165427 A1 | 8/2004 | Jeong | |
| 2005/0078510 A1 | 4/2005 | Jeong | |
| 2005/0117391 A1 | 6/2005 | Yoda | |
| 2008/0212364 A1 | 9/2008 | Mani | |
| 2009/0010046 A1 | 1/2009 | Mani | |
| 2009/0059654 A1 | 3/2009 | Mani | |
| 2009/0065883 A1 | 3/2009 | Wang | |
| 2009/0067231 A1 | 3/2009 | Mani | |
| 2009/0128966 A1 | 5/2009 | Mani | |
| 2009/0141542 A1 | 6/2009 | Mani | |
| 2009/0227045 A1 | 9/2009 | Li | |
| 2009/0243009 A1 | 10/2009 | Li | |
| 2010/0019297 A1* | 1/2010 | Hwang | H01L 27/228 257/295 |
| 2010/0193888 A1 | 8/2010 | Gu | |
| 2010/0207952 A1 | 8/2010 | Mani | |
| 2010/0208514 A1 | 8/2010 | Mani | |
| 2010/0220524 A1 | 9/2010 | Mani | |
| 2010/0315870 A1 | 12/2010 | Abedifard | |
| 2011/0032755 A1* | 2/2011 | Mani | G11C 11/16 365/171 |
| 2011/0044096 A1 | 2/2011 | Li | |
| 2011/0163400 A1* | 7/2011 | Ono | B82Y 25/00 257/421 |
| 2011/0249491 A1 | 10/2011 | Abedifard | |
| 2011/0303998 A1* | 12/2011 | Ranjan | G11C 11/5607 257/421 |
| 2012/0087180 A1 | 4/2012 | Mani | |
| 2013/0016554 A1 | 1/2013 | Abedifard | |
| 2013/0187247 A1* | 7/2013 | Wu | G11C 11/161 257/421 |
| 2013/0208536 A1* | 8/2013 | Allenspach | B82Y 10/00 365/158 |
| 2014/0254250 A1* | 9/2014 | Mani | H01L 43/08 365/158 |
| 2014/0284739 A1* | 9/2014 | Mani | G11C 8/00 257/421 |
| 2014/0284740 A1* | 9/2014 | Mani | G11C 8/00 257/421 |
| 2015/0035098 A1* | 2/2015 | Mani | G11C 11/36 257/421 |
| 2015/0161316 A1* | 6/2015 | Mani | G06F 17/5068 257/421 |
| 2015/0355272 A1* | 12/2015 | Mani | G01R 31/2884 324/713 |
| 2015/0380639 A1* | 12/2015 | Mani | G11C 8/00 438/3 |

\* cited by examiner

MEMORY CIRCUIT AND METHOD OF FORMING THE SAME USING REDUCED MASK STEPS

CROSS REFERENCE TO RELATED APPLICATIONS

This application is a continuation of U.S. patent application Ser. No. 14/264,914, filed Apr. 29, 2014, which is a divisional of U.S. patent application Ser. No. 12/960,430, filed Dec. 30, 2010, and issued as U.S. Pat. No. 8,711,612, on Apr. 29, 2014.

FIELD

Embodiments of the invention relate to a memory circuit using magnetic storage elements and particularly relate to magnetic random access memory (MRAM) circuits.

BACKGROUND

Magnetic (or magneto-resistive) random access memory (MRAM) circuits have several desirable characteristics such as high speed, high density (i.e., small bit cell size), low power consumption, and no degradation over time, particularly over the dynamic random access memory (DRAM) circuit. MRAM circuits are integrated typically with a complementary metal-oxide semiconductor (CMOS) technology.

FIG. 1A illustrates a section of an exemplary layout for an MRAM circuit 100A, that includes a set of first conducting lines 118 to form word lines and a set of second conducting lines 102 to form bit lines. The set of second conducting lines 102 overlies the set of first conducting lines 118 to define crossover zones 103. Addressable magnetic storage element stacks 122 are disposed within the crossover zones 103. Current drivers 101 are provided for energizing the first conducting lines 118 and the second conducting lines 102. Each of the magnetic storage element stacks 122 correspond to a bit cell in the MRAM circuit 100A, and is isolated from other magnetic storage element stacks 122.

FIG. 1B illustrates a cross sectional view of two adjacent magnetic storage element stacks 122 between the first conducting line 118 and the second conducting line 102, in the region marked 'X' in FIG. 1A. In FIG. 1B, an access transistor 124 is also shown schematically, corresponding to each of the two magnetic storage element stacks 122, to represent two bit cells A and B. The magnetic storage element stacks 122 are designed to be integrated into a back-end metallization structure following a front-end CMOS processing. In a bit cell, the magnetic storage element stack 122 includes a structure having two ferromagnetic layers which are referred to as a 'fixed layer' 110 and a 'free layer' 106. The two layers 110,106, are separated by a non-magnetic barrier layer that is referred to as 'a tunnel oxide layer' 108. All the three layers along with an extended bottom electrode 112 are arranged to form a magnetic tunnel junction (MTJ) stack 122. The free layer 106 is connected to an upper metallization layer through an upper interface via hole 104. The bottom electrode 112 is connected to a lower metallization layer, through a lower interface via hole 116. The upper metallization layer is patterned to include the bit lines corresponding to each MTJ stack 122. The lower metallization layer is patterned to include a write word line 118c and a read word line 118b, for reading and writing operations from and into each MTJ stack 122. A connection 118a between the lower metallization layer and a corresponding access transistor 124 for the reading operation in a bit cell, is also shown. The write word line 118c for the writing operation in a bit tell has no contact with the bottom electrode 112, and when energized, induces a magnetic field at a junction of the MTJ stack 122. The upper and lower metallization layers are shown to be an M3 layer and an M2 layer respectively. For fabricating this structure with the MTJ stack 122, after patterning the M2 layer and before forming the M3 layer, four masking and etching steps are likely to be required, such as: a) lower interface via mask and etch for defining the lower interface via hole 116, in order to connect the individual bottom electrodes 112 to the lower metallization layer, b) bottom electrode mask and etch for defining the individual bottom electrodes 112, c) magnetic stack etch mask and etch for defining the individual MTJ stacks 122 up to the bottom electrode 112, and d) upper interface via mask and etch for defining the upper interface via hole 104, in order to connect the free layers 106 to the upper metallization layer. The fully isolated individual magnetic storage element stacks 122 are encapsulated by dielectric regions 120. Smaller the area of the MTJ stack 122, better is the efficiency of the writing operation. For each of the bit cells A and B, the bottom electrode 112 extends beyond the area of the free layer 106, the tunnel oxide layer 108 and the fixed layer 110, and accommodates the corresponding write word line 118c and the corresponding read lines 118a,b.

SUMMARY OF THE INVENTION

A first aspect of the invention provides a memory circuit. A lower metallization layer defines first conducting lines. A continuous magnetic storage element stack is over the lower metallization layer and a bottom electrode of the stack is in direct contact with the first conducting lines. An upper metallization layer is over the continuous magnetic storage element stack. The upper metallization layer defines second conducting lines, which are in direct contact with the continuous magnetic storage element stack. Localized areas of the continuous magnetic storage element stack define discrete magnetic bits, each energizable through a selected pair of the first and second conducting lines.

A second aspect of the invention provides a memory circuit. A lower metallization layer defines first conducting lines. A magnetic tunnel junction (MTJ) stack is over the patterned lower metallization layer and a bottom electrode of the stack is in direct contact with the first conducting lines. The stack has a top free layer, a middle tunnel oxide layer and a bottom fixed layer overlying the bottom electrode. The stack is patterned through a single mask, by etching the top free layer until the tunnel oxide layer, to define partially isolated individual stacks. An upper metallization layer is over the partially isolated individual stacks and defines second conducting lines, which are in direct contact with the partially isolated individual stacks. The partially isolated individual stacks are encapsulated by dielectric regions and define discrete magnetic bits, each energizable through a selected pair of the first and second conducting lines.

A third aspect of the invention provides a memory circuit. A lower metallization layer defines first conducting lines. A magnetic tunnel junction (MTJ) stack is over the patterned lower metallization layer and a bottom electrode of the stack is in direct contact with the first conducting lines. The stack has a top free layer, a middle tunnel oxide layer and a bottom fixed layer overlying the bottom electrode. The stack is patterned by etching through a single mask, to define fully isolated individual stacks. An upper metallization layer is over the fully isolated individual stacks to define second conducting lines, which are in direct contact with said fully isolated individual stacks. The fully isolated individual stacks are encapsulating by dielectric regions and define discrete magnetic bits, each energizable through a selected pair of the first and second conducting lines.

A fourth aspect of the invention provides a method for forming a memory circuit. The method includes the steps of patterning a lower metallization layer to define first conducting lines, followed by forming a continuous magnetic storage element stack over the patterned lower metallization layer, such that a bottom electrode of the stack is in direct contact with the first conducting lines. This is followed by forming an upper metallization layer over the continuous magnetic storage element stack and then by patterning the upper metallization layer to define second conducting lines, which are in direct contact with said continuous magnetic storage element stack. Localized areas of the continuous magnetic storage element stack define discrete magnetic bits, each energizable through a selected pair of the first and second conducting lines.

According to an embodiment of each of the first and the fourth aspects of the invention, the magnetic storage element stack has a magnetic tunnel junction (MTJ) stack.

A fifth aspect of the invention provides a method for forming a memory circuit. The method includes the steps of patterning a lower metallization layer to define first conducting lines, followed by forming a continuous magnetic storage element stack over said patterned lower metallization layer such that a bottom electrode of the stack is in direct contact with the first conducting lines. The stack has a top free layer, a middle tunnel oxide layer and a bottom fixed layer overlying the bottom electrode. This is followed by patterning the stack through a single mask, by etching the top free layer until the tunnel oxide layer, to define partially isolated individual stacks. This is followed by forming an upper metallization layer over the partially isolated individual stacks and then patterning the upper metallization layer to define second conducting lines, which are in direct contact with the partially isolated individual stacks. The partially isolated individual stacks are encapsulated by dielectric regions. The partially isolated individual stacks define discrete magnetic bits, each energizable through a selected pair of the first and second conducting lines.

A sixth aspect of the invention provides a method for forming a memory circuit. The method includes the steps of patterning a lower metallization layer to define first conducting lines, followed by forming a continuous magnetic storage element stack over the patterned lower metallization layer such that a bottom electrode of the stack is in direct contact with the first conducting lines. The stack has a top free layer, a middle tunnel oxide layer and a bottom fixed layer overlying the bottom electrode. This is followed by patterning the stack through a single mask, by etching to define fully isolated individual stacks, then forming an upper metallization layer over the fully isolated individual stacks, and then patterning the upper metallization layer to define second conducting lines, which are in direct contact with the fully isolated individual stacks. The fully isolated individual stacks are encapsulated by dielectric regions. The fully isolated individual stacks define discrete magnetic bits, each energizable through a selected pair of the first and second conducting lines.

According to an embodiment for each of the first to the sixth aspects of the invention, the lower metallization layer has an M2 layer and the upper metallization layer has an M3 layer.

According to another embodiment for each of the first to the sixth aspects of the invention, the first conducting lines have a plurality of word lines and the second conducting lines have a plurality of bit lines.

According to the first and fourth aspects of the invention, the four masking and etching steps as described in the foregoing 'Background' section can be avoided. Similarly, according to the second and fifth aspects of the invention, etching the top free layer until the tunnel oxide layer is achieved through only a single mask and a partial etch. According to the third and sixth aspects of the invention, full etching of the stack is achieved through only a single mask. All these aspects of the invention and their embodiments enable significant savings in the processing time and cost. Reduced number of processing steps also enhance yield.

DETAILED DESCRIPTION

In the following description, for purposes of explanation, numerous specific details are set forth in order to provide a thorough understanding of the invention. It will be apparent, however, to one skilled in the art that the invention can be practiced without these specific details.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Figure 1A:
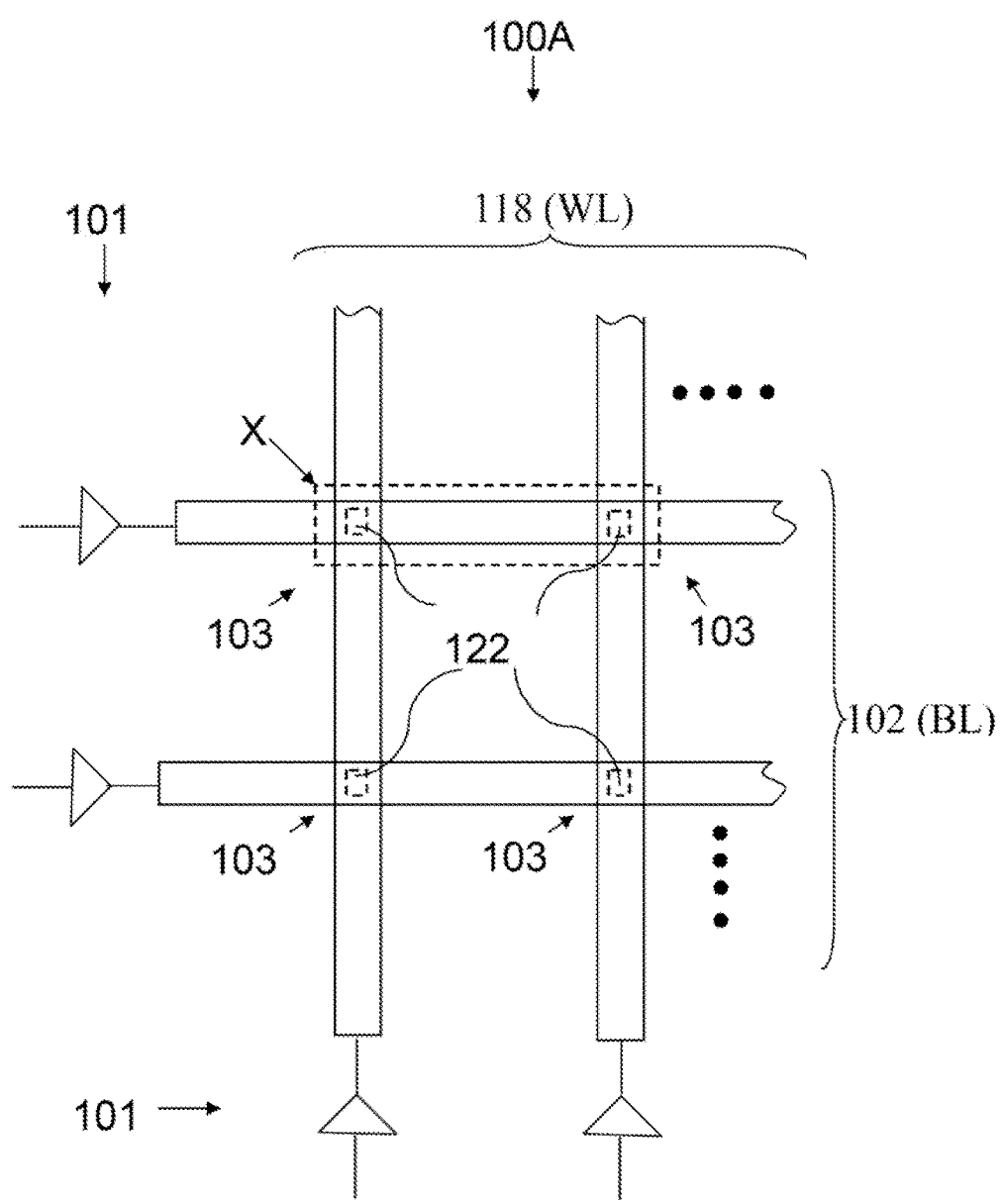
FIG. 1A illustrates a section of an exemplary layout for an MRAM circuit. A set of second conducting lines overlies a set of first conducting lines to define crossover zones. Addressable magnetic storage element stacks are disposed within the crossover zones. Each of the magnetic storage element stacks correspond to a bit cell in the MRAM circuit.
Figure 1B:
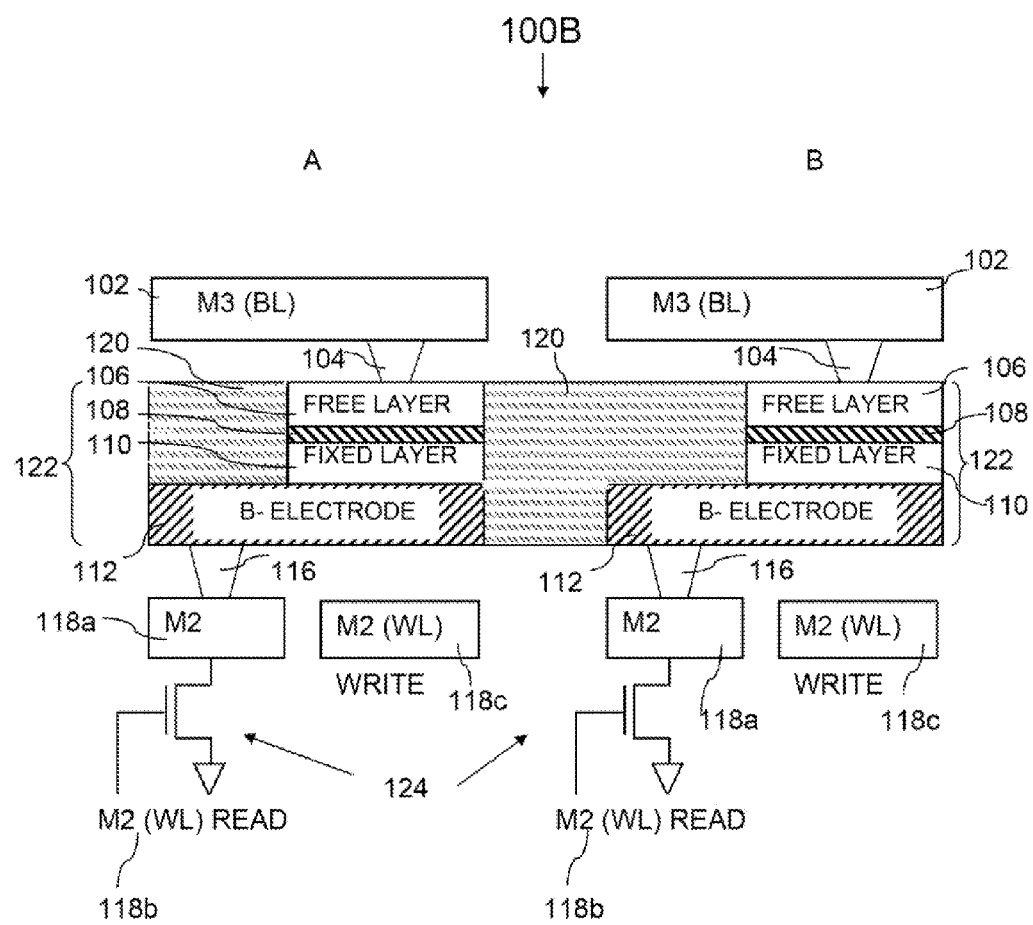
FIG. 1B illustrates a cross sectional view of two adjacent magnetic storage element stacks in the region marked 'X' in FIG. 1A. Each stack has a corresponding access transistor as shown schematically, to represent two bit cells A and B. The two magnetic storage element stacks are isolated from each other.
Figure 2:
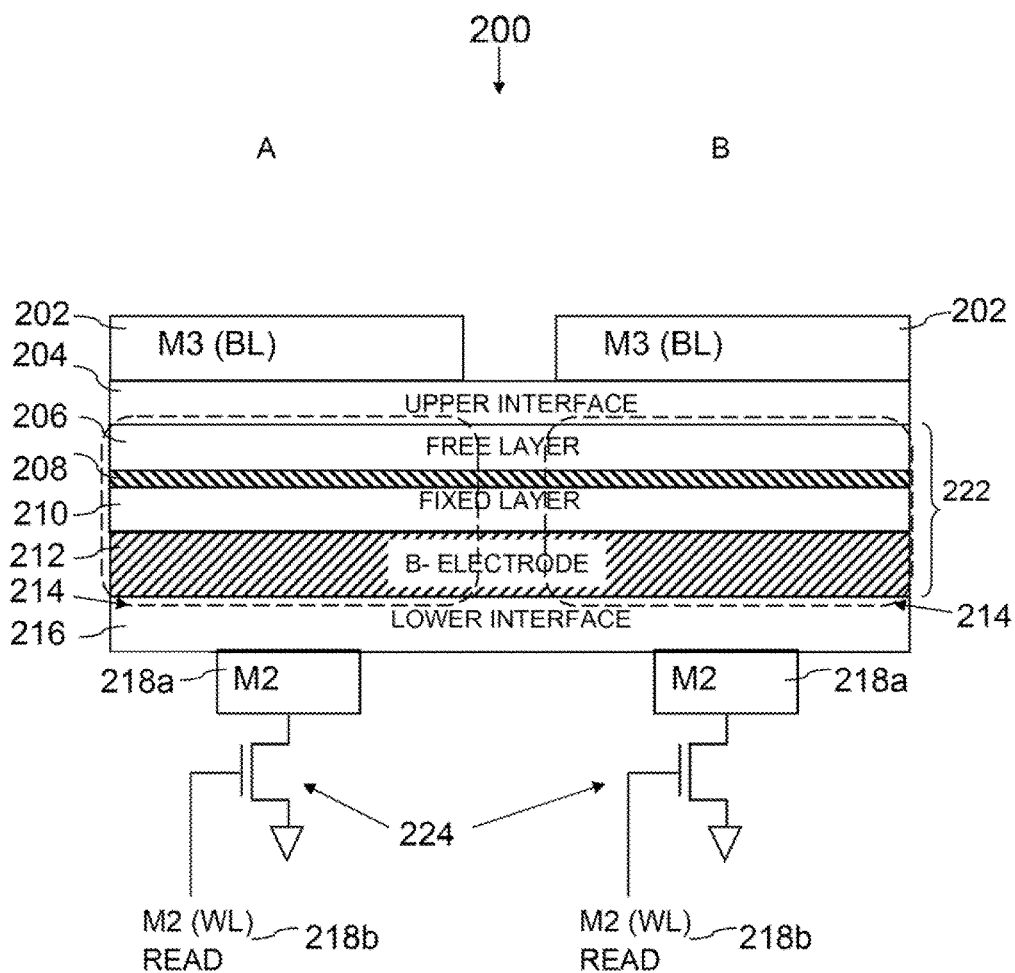
FIG. 2 illustrates a view similar to that of FIG. 1B and according to an embodiment of the invention. In this embodiment, the magnetic storage element stack is continuous between the bit cells A and B, requiring use of reduced masking and etching steps.

FIG. 2 illustrates a section of an MRAM circuit 200, according to an embodiment of the invention, showing the arrangement for the two adjacent bit cells A and B. The magnetic storage element stack 222 is designed to be integrated into a back-end metallization structure following a front-end CMOS processing. A lower metallization layer defines the first conducting lines 218a and 218b. The continuous magnetic storage element stack 222 overlies the lower metallization layer, such that the bottom electrodes 212 of the stack 222 are in direct contact with the first conducting lines 218a. The term 'direct contact' here indicates that there is no via hole for making the contact and that there may be one or more intermediate conducting layers, as shown by a lower interface layer 216. An upper metallization layer overlies the continuous magnetic storage element stack 222, the upper metallization layer defining second conducting lines 202, which are in direct contact with said continuous magnetic storage element stack 222. The term 'direct contact' here again indicates that there is no via hole for making the contact and that there may be one or more intermediate conducting layers, as shown by an upper interface layer 204. Localized areas of said continuous magnetic storage element stack 222 define discrete magnetic bits 214, each energizable through a selected pair from the first conducting lines 218a, 218b, and the second conducting lines 202. A connection between the lower metallization layer and a corresponding access transistor 224 for the reading operation from either bit cell, is also shown. A method of forming the memory circuit 200 includes the steps of patterning the lower metallization layer to define the first conducting lines 218a, 218b, followed by forming the continuous magnetic storage element stack 222 over said patterned lower metallization layer, such that the bottom electrodes 212 are in direct contact with the first conducting lines 218a. This is followed by forming the upper metallization layer over the continuous magnetic storage element stack 222 and then by patterning the upper metallization layer to define second conducting lines 202, which are in direct contact with said continuous magnetic storage element stack 222. With this embodiment, all the four masking and etching steps a) to d) as described in the foregoing 'Background' section, can be avoided.

Figure 3:
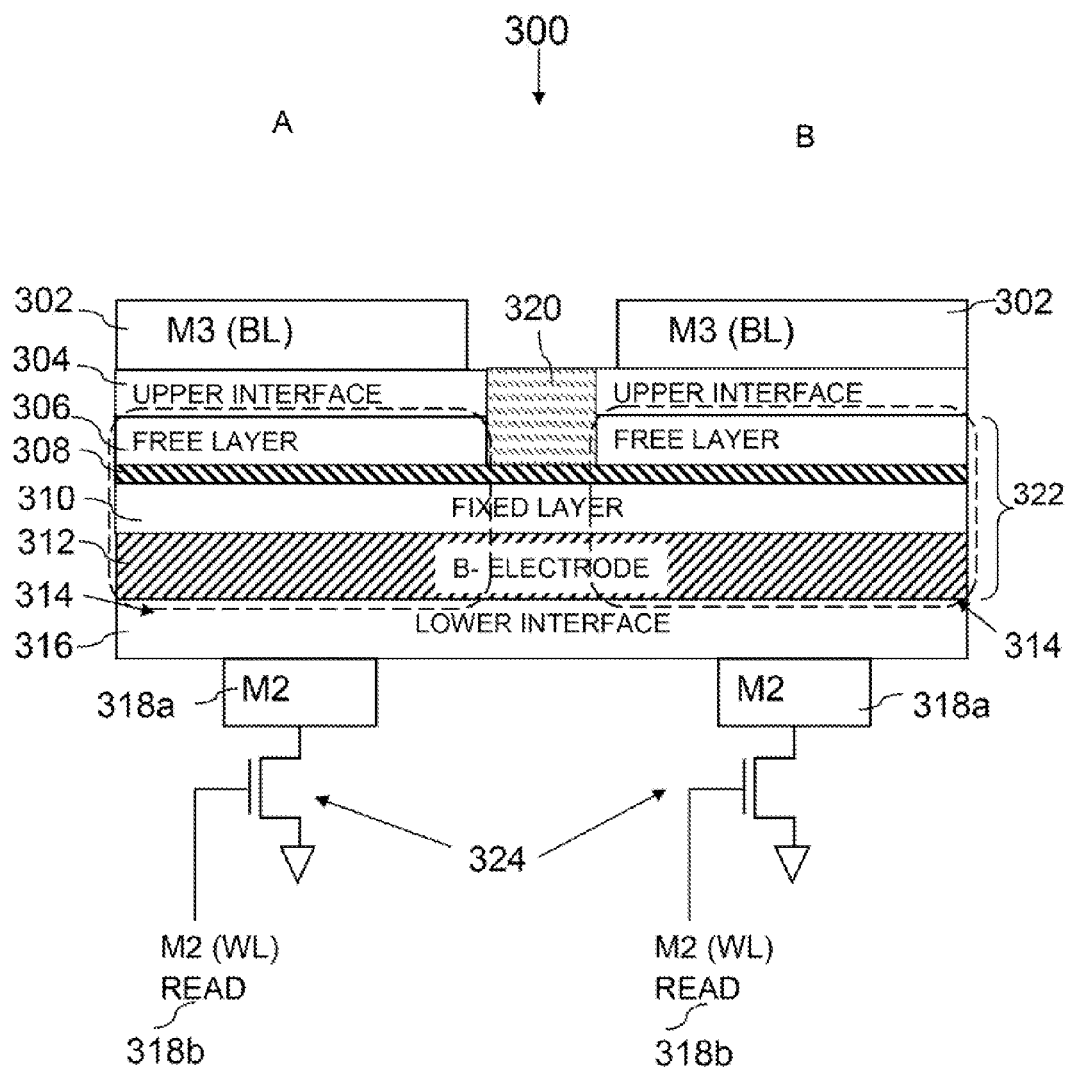
FIG. 3 illustrates a view similar to that of FIG. 1B and according to an embodiment of the invention. In this embodiment, the magnetic storage element stack is patterned through a single mask, to define partially isolated individual stacks for the two bit cells A and B.

FIG. 3 illustrates a section of an MRAM circuit 300, according to an embodiment of the invention, showing the arrangement for the two adjacent bit cells A and B. The magnetic storage element stack 322 is designed to be integrated into a back-end metallization structure following a front-end CMOS processing. A lower metallization layer defines the first conducting lines 318a, 318b. A magnetic tunnel junction (MTJ) stack 322 is over the patterned lower metallization layer and the bottom electrodes 312 of the stack 322 are in direct contact with the first conducting lines 318a. The term 'direct contact' here indicates that there is no via hole for making the contact and that there may be one or more intermediate conducting layers, as shown by a lower interface layer 316. The stack 322 has a top free layer 306, a middle tunnel oxide layer 308 and a bottom fixed layer 310 over the bottom electrode 312. The stack 322 is patterned through a single mask, by etching the top free layer 306 until the tunnel oxide layer 308, to define partially isolated individual stacks 322. An upper metallization layer is over the partially isolated individual stacks 322 and defines second conducting lines 302, which are in direct contact with said partially isolated individual stacks. The term 'direct contact' here again indicates that there is no via hole for making the contact and that there may be one or more intermediate conducting layers, as shown by an upper interface layer 304. The partially isolated individual stacks 322 are encapsulated by dielectric regions 320. The partially isolated individual stacks 322 define discrete magnetic bits 314, each energizable through a selected pair from the first conducting lines 318a, 318b and the second conducting lines 302. A connection between the lower metallization layer and a corresponding access transistor 324 for the reading operation from either bit cell, is also shown. A method for forming the memory circuit 300 includes the steps of patterning the lower metallization layer to define the first conducting lines 318a, 318b, followed by forming the continuous magnetic storage element stack 322 over the patterned lower metallization layer, such that the bottom electrodes 312 of the stack 322 are in direct contact with the first conducting lines 318a. This is followed by patterning the stack 322 by etching the top free layer 306 until the tunnel oxide layer 308 through a single mask, to define partially isolated individual stacks 322. This is followed by forming the upper metallization layer over the partially isolated individual stacks 322 and then patterning the upper metallization layer to define second conducting lines 302, which are in direct contact with said partially isolated individual stacks 322. The partially isolated individual stacks 322 are encapsulated by dielectric regions 320 before forming the upper metallization layer or after patterning the upper metallization layer. With this embodiment, the three masking and etching steps as described at a), b) and d) in the foregoing 'Background' section can be avoided. The masking and etching step at c) undergoes a partial etch in this aspect of the invention.

Figure 4:
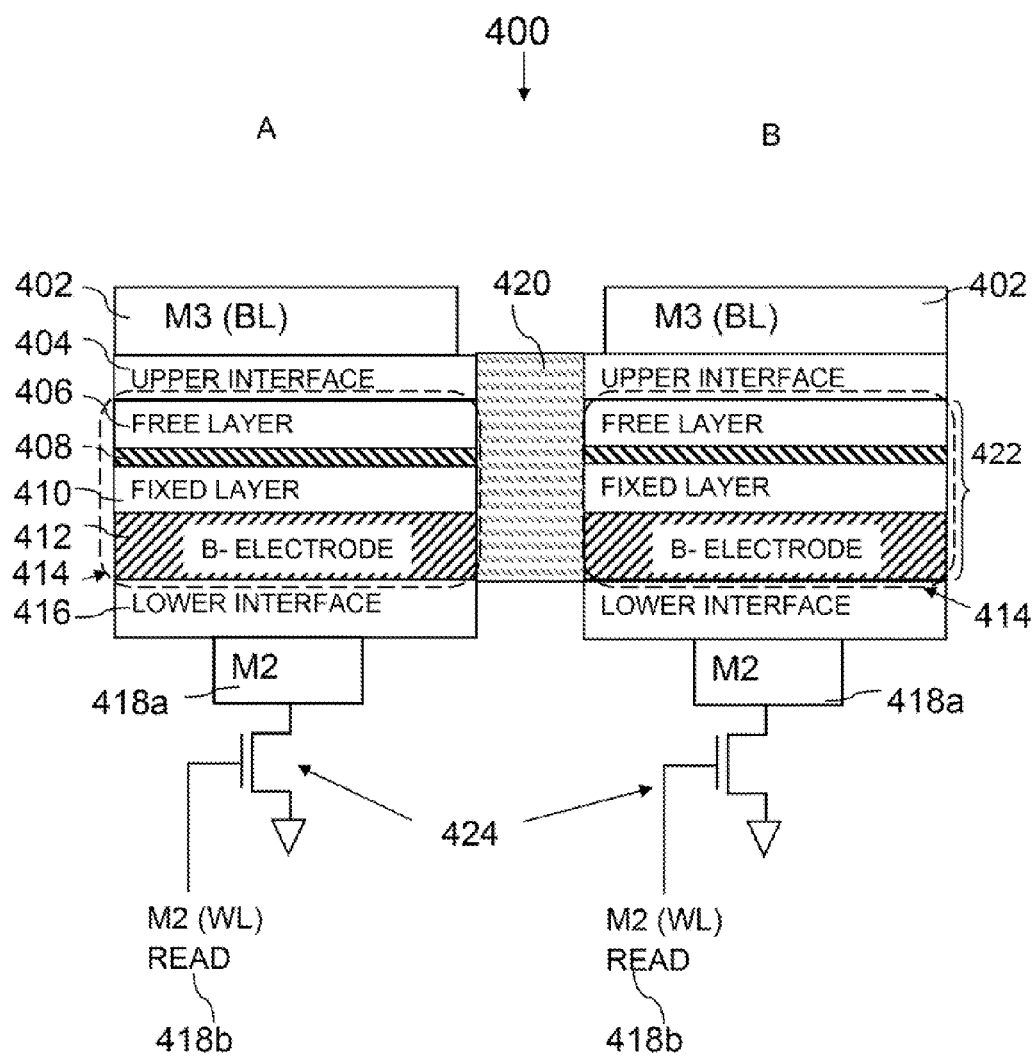
FIG. 4 illustrates a view similar to that of FIG. 1B and according to an embodiment of the invention. In this embodiment, the magnetic storage element stack is patterned through a single mask, to define fully isolated individual stacks for the two bit cells A and B.

FIG. 4 illustrates a section of an MRAM circuit 400, according to an embodiment of the invention, showing the arrangement for the two adjacent bit cells A and B. The magnetic storage element stack 422 is designed to be integrated into a back-end metallization structure following a front-end CMOS processing. The memory circuit 400 includes a lower metallization layer defining first conducting lines 418a, 418b. A magnetic tunnel junction (MTJ) stack 422 is over the patterned lower metallization layer and the bottom electrodes 412 of the stack 422 are in direct contact with the first conducting lines 418a. The term 'direct contact' here indicates that there is no via hole for making the contact and that there may be one or more intermediate conducting layers, as shown by a lower interface layer 416. The stack 422 has a top free layer 406, a middle tunnel oxide layer 408 and a bottom fixed layer 410 overlying the bottom electrode 412. The stack 422 is patterned through a single mask, by etching, to define fully isolated individual stacks 422. An upper metallization layer is over the fully isolated individual stacks 422 defining second conducting lines 402, which are in direct contact with said fully isolated individual stacks 422. The fully isolated individual stacks 422 are encapsulating by dielectric regions 420. The fully isolated individual stacks 422 define discrete magnetic bits 414, each energizable through a selected pair from the first conducting lines 418a, 418b and the second conducting lines 402. A connection between the lower metallization layer and a corresponding access transistor 424 for the reading operation from either bit cell, is also shown. A method for forming the memory circuit 400 includes the steps of patterning the lower metallization layer to define the first conducting lines 418, followed by forming the continuous magnetic storage element stack 422 over the patterned lower metallization layer such that the bottom electrodes 412 of the stack 422 are in direct contact with the first conducting lines 418a. This is followed by patterning the stack 422 through a single mask, by etching the stack 422, to define fully isolated individual stacks 422. This is followed by forming the upper metallization layer over the fully isolated individual stacks 422 and then patterning the upper metallization layer to define second conducting lines 402, which are in direct contact with said fully isolated individual stacks 422. The fully isolated individual stacks 422 are encapsulated by dielectric regions 420 before forming the upper metallization layer or after patterning the upper metallization layer.

According to the embodiments shown in FIGS. 2-4, the respective magnetic storage element stack 222, 322, 422 has magnetic tunnel junction (MTJ) stack, while the lower metallization layer has an M2 layer and the upper metallization layer has an M3 layer. However, any other set of consecutive layers in a backend process may equally be used, depending on the number of metal layers stacked in the back-end process, the convenience of processing and the attainable performance for the respective memory circuit 200, 300, 400. Also, the first conducting lines 218(a,b), 318(a,b), 418(a,b) include a plurality of word lines and the second conducting lines 202, 302, 402 include a plurality of bit lines. Only two bit cells A and B are shown, however, the scope of the embodiments of the invention does not limit the numbers of the bit cells. The scope of the embodiments of the invention is also not limited to any particular technology in terms of processing sequence, materials, physical dimensions and the like.

The embodiments as described in FIGS. 2-4 may however suffer from drawbacks in performance of the memory circuits 200,300,400. The continuous magnetic storage element stack 222 remains susceptible to interference effects between adjacent magnetic bits 214. The partially isolated individual stacks 322 also remains susceptible to interference effects between adjacent magnetic bits 314. The partially isolated individual stacks 322 have the free layers 306 for the magnetic bits 314 isolated from each other by the dielectric region 320, hence the interference effect is likely to be lesser as compared to the case when the continuous magnetic storage element stack 222 is used. The fully isolated individual stacks 422 have all the four layers (free layer 406, tunnel oxide layer 408, fixed layer 410 and bottom electrode 412) for the magnetic bits 414 isolated from each other by the dielectric region 420, hence the interference effect is likely to be least as compared to the case when the continuous magnetic storage element stack 222 or the partially isolated individual stacks 322 is used. As illustrated in FIG. 16, the write operation uses a write word line 118c for inducing a magnetic field at the junction. However, in the embodiments of the invention illustrated in FIGS. 2-4, since the bottom electrodes 212, 312, 412 directly make contact with the lower metallization layer, the inducing action as achievable by the write word line 118c is not possible. Hence, the embodiments of the present invention can be used for read operations only, unless alternate arrangements are made for writing operation.

In consideration with the aforesaid limitations, the aspects and embodiments of the present invention embodiments may however be useful for applications where maintaining low cost for the memory circuits 200, 300, 400 is of higher priority than the quality of performance. One such application may be for memory circuits 200, 300, 400 which are of disposable types, which are designed for short term usages and are of lower complexity. The interference effects may be reduced by increasing the distance between the magnetic bits 214, 314, 414 in the layout design for the memory circuits 200, 300, 400 which would however be at the cost of increased area. Similarly, the aspects and embodiments of the present invention embodiments may be useful for applications where only reading operation is required, and not writing operation.

All the aspects of the invention provides a memory circuit, that is compatible with any semiconductor technology such as complementary metal-oxide-semiconductor (CMOS), bipolar-junction-transistor and CMOS (BiCMOS), silicon-on-insulator (SOI) and the like. The embodiments of the invention are equally applicable when any other type of magnetic storage element stack 222, 322, 422 is used.

Although the present invention has been described with reference to specific exemplary embodiments, it will be evident that the various modification and changes can be made to these embodiments without departing from the broader spirit of the invention. Accordingly, the specification and drawings are to be regarded in an illustrative sense rather than in a restrictive sense.

The invention claimed is:

1. A method comprising:
   patterning a lower metallization layer to define a plurality of first conducting lines;
   forming a magnetic storage element stack over the plurality of first conducting lines, wherein the magnetic storage element stack directly contacts the plurality of first conducting lines;
   forming an upper metallization layer over the magnetic storage element stack; and
   patterning the upper metallization layer to form a plurality of second conducting lines, wherein the magnetic storage element stack directly contacts the plurality of second conducting lines.

2. The method of claim 1, wherein the magnetic storage element stack comprises a magnetic tunnel junction (MTJ) stack.

3. The method of claim 1, wherein the lower metallization layer comprises an M2 layer.

4. The method of claim 1, wherein the upper metallization layer comprises an M3 layer.

5. The method of claim 1, wherein:
   the lower metallization layer comprises an M2 layer; and
   the upper metallization layer comprises an M3 layer.

6. The method of claim 1, wherein the plurality of first conducting lines comprises a plurality of word lines.

7. The method of claim 1, wherein the plurality of second conducting lines comprises a plurality of bit lines.

8. The method of claim 1, wherein:
   the plurality of first conducting lines comprises a plurality of word lines; and
   the plurality of second conducting lines comprises a plurality of bit lines.

9. The method of claim 1, wherein:
   a portion of the magnetic storage element stack in between a first one of the plurality of first conducting lines and a first one of the plurality of second conducting lines is included in a first bit cell; and
   a portion of the magnetic storage element stack in between a second one of the plurality of first conducting lines and a second one of the plurality of second conducting lines is included in a second bit cell.

* * * * *